United States Patent
Lin et al.

(10) Patent No.: US 7,342,982 B2
(45) Date of Patent: Mar. 11, 2008

(54) DEMODULATION APPARATUS FOR A NETWORK TRANSCEIVER AND METHOD THEREOF

(75) Inventors: Hou-Wei Lin, Taipei (TW);
Shieh-Hsing Kuo, Taipei (TW);
Meng-Han Hsieh, Changhua County (TW); Kuang-Yu Yen, Taichung (TW)

(73) Assignee: Realtek Semiconductor Corp., HsinChu (TW)

( * ) Notice: Subject to any disclaimer, the term of this patent is extended or adjusted under 35 U.S.C. 154(b) by 753 days.

(21) Appl. No.: 10/687,771

(22) Filed: Oct. 20, 2003

(65) Prior Publication Data
US 2004/0091071 A1 May 13, 2004

(30) Foreign Application Priority Data
Nov. 7, 2002 (TW) ................. 91132821 A

(51) Int. Cl.
*H04B 1/10* (2006.01)
(52) U.S. Cl. ............................................. 375/350
(58) Field of Classification Search ........ 375/348–355, 375/341, 229, 230, 232, 233, 350; 379/340, 379/398; 708/232
See application file for complete search history.

(56) References Cited

U.S. PATENT DOCUMENTS 4,893,316 A * 1/1990 Janc et al. ............... 708/300
5,581,585 A * 12/1996 Takatori et al. ............ 375/376
6,928,106 B1 * 8/2005 Agazzi ...................... 375/219

FOREIGN PATENT DOCUMENTS

| JP | 04-249429 | 9/1992 |
| JP | 06-037591 | 2/1994 |
| JP | 2000-224080 | 8/2000 |
| JP | 2003-308655 | 10/2003 |

* cited by examiner

Primary Examiner—Sam K. Ahn
(74) Attorney, Agent, or Firm—Winston Hsu

(57) ABSTRACT

A transceiver of a communication system is disclosed. The transceiver is implemented by a demodulation apparatus including a front-end receiver, a noise canceller, a feedforward equalizer (FFE) and a decoding system. The front-end receiver receives a remote signal and converts it into a first signal with a pre-cursor and a post-cursor in digital form. The noise canceller is coupled to the front-end receiver for subtracting a noise signal from the first signal and thus generates a second signal. The FFE is coupled to the noise canceller for eliminating the pre-cursor in the second signal and thus generates a third signal. The decoding system is coupled to the FFE for decoding the third signal and eliminating the post-cursor in the third signal.

4 Claims, 5 Drawing Sheets

DEMODULATION APPARATUS FOR A NETWORK TRANSCEIVER AND METHOD THEREOF

CROSS REFERENCE TO RELATED APPLICATIONS

The present application is related to the en-pending application entitled "Demodulat ion apparatus for a network transceiver and method thereof", application Ser. No. 10/687,671, filed on the same day as the present application and assigned to the same assignee, the contents of which are herein incorporated by reference.

BACKGROUND OF THE INVENTION

1. Field of the Invention

The present invention relates to a network transceiver for Ethernet communication system and a method thereof, and more particularly, to an apparatus for estimating, equalizing and demodulating of a transceiver for Gigabit Ethernet system and a method thereof.

2. Description of Related Art

For an Ethernet system, a receiver to accurately receive data at a receiving-end may include the following devices: a feed-forward equalizer (FFE), a feed-back equalizer (FBE), a timing recovery (TR), an ECHO canceller, an NEXT (Near-End-Cross-Talk) canceller, etc. In order to find the appropriate coefficients of the devices, the conventional method, which is known to be a data-directed approach, is that the transceiver of the transmitting end transmits signals known by both ends to the transceiver of the receiving end and the appropriate coefficients for the devices of the receiving end are determined according to the receiving known signals.

However, according to the IEEE 802.3ab standard, a decision-directed approach is introduced to determine and/or adjust the appropriate operating coefficients of the devices. When determining the appropriate operating coefficients of the devices, the receiving signals are unknown by the receiver in advance. However, since the operation of the devices may have interaction to each other when determining the coefficients, the determined coefficients of the devices may not be converged to an appropriate value. Thus, signals transmitted by the transceiver cannot be received.

In a Gigabit Ethernet communication system, the transmission rate is up to 125 MSPS. Therefore, with consideration of chip area and power consumption, a configuration of baud-rate signal processing is adapted. Due to the Decision-Directed Adaptation and baud-rate signal processing configuration, a serious interaction appears among for example, an echo canceller and NEXT canceller and a feedforward equalizer (FFE), the FFE and the timing recovery (TR), the FFE and the feedback equalizer (FBE).

In the conventional Gigabit Ethernet systems shown in FIG. 1, slicer errors are considered as the error signal for adjusting the echo canceller and the NEXT canceller. Both cancellers are placed behind the FFE. However, the coefficients of echo and NEXT canceller may change along with the change of the coefficients of the FFE. It may cause serious interaction and the speed of the convergence of the coefficients thus becomes slower. The conventional method is to fix the coefficients of the echo and NEXT cancellers. However the performance of the Gigabit Ethernet communication system may thus be degraded.

Therefore, it is desirable to provide an improved demodulation apparatus for a network transceiver and the method thereof to mitigate and/or obviate the aforementioned problems.

SUMMARY OF THE INVENTION

An object of the present invention is to provide a network transceiver and the method thereof to avoid poor performance or system divergence from interaction between devices.

To achieve the objects, a transceiver of a communication system is disclosed. The transceiver comprises a front-end receiver for generating a first signal with a pro-cursor component and a post-cursor component according to a receiving signal, wherein the front-end receiver further includes an inverse partial response (IPR) filter to compensate an ISI introduced by a partial response filter in a transmitter part of a remote transceiver and an analog-to-digital (A/D) converter to receive an output signal of the IPR filter and convert the output signal to the first signal with a digital format; a noise canceller coupled to the front-end receiver for generating a second signal through eliminating the noise of the first signal; a Feed-Forward Equalizer (FFE) coupled to the noise canceller fur generating a third signal through eliminating the pre-cursor component in the second signal according to a transfer function including a plurality of adjustable constants, wherein the adjustable constants include a main-tap and the value of the main-tap is predetermined; and a decoder coupled to the FFE for decoding the third signal and eliminating the post-cursor component in the third signal.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
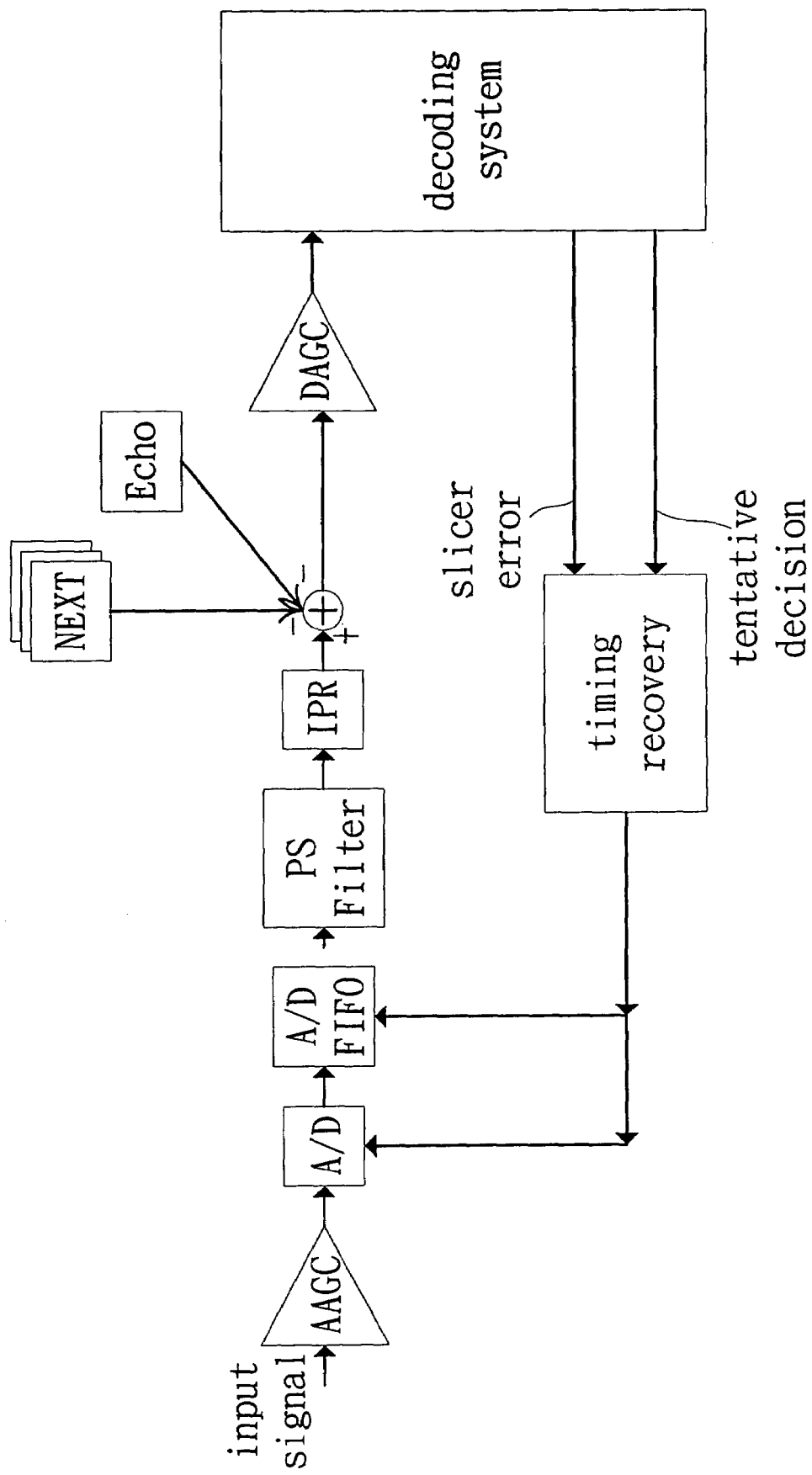
FIG. 1 is a diagram of a system configuration of a receiver for a conventional Gigabit Ethernet transceiver.
Figure 2:
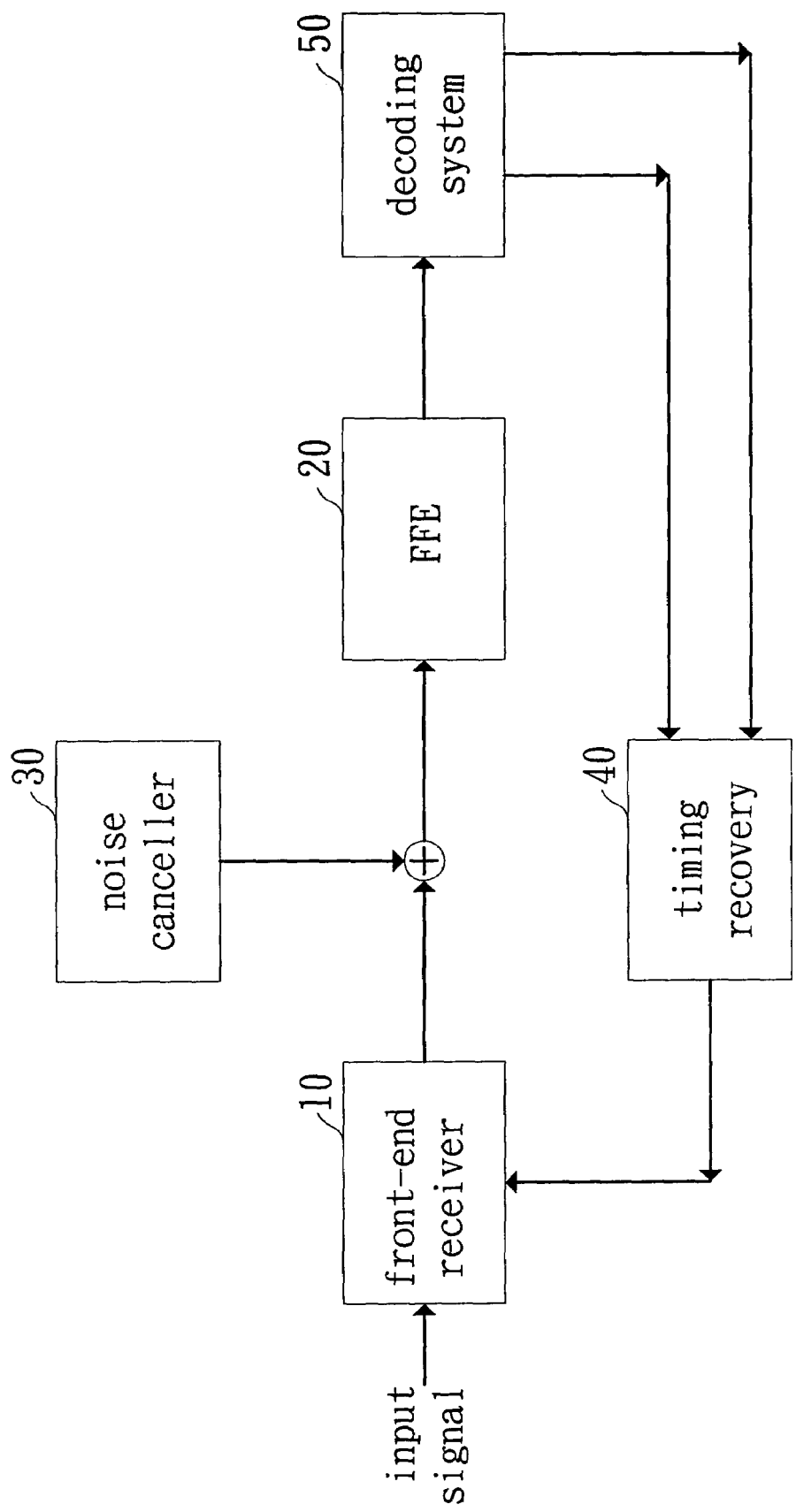
FIG. 2 is a diagram of a system configuration of a receiver for a Gigabit Ethernet transceiver according to the embodiment of the present invention.

FIG. 2 shows a preferred embodiment of a receiver for a network transceiver according to the present invention. In FIG. 2, the receiver includes a front-end receiver 10, a feed-forward equalizer (FFE) 20, a noise canceller 30, a tuning recovery (TR) 40 and a decoding system 50. The front-end receiver 10 is for receiving a signal and converting the signal to a first signal in digital form with a pre-cursor component and a post-cursor component. The noise canceller 30 is coupled to the front-end receiver 10 for eliminating the noise of the first signal and thus generating a second signal. The FFE 20 is coupled to the noise canceller 30 for eliminating the pitcursor component in the second signal and thus generating a third signal. The decoding system 50 is coupled to the FFE 20 for decoding the third signal and eliminating the post-cursor component in the third signal.

Figure 3:
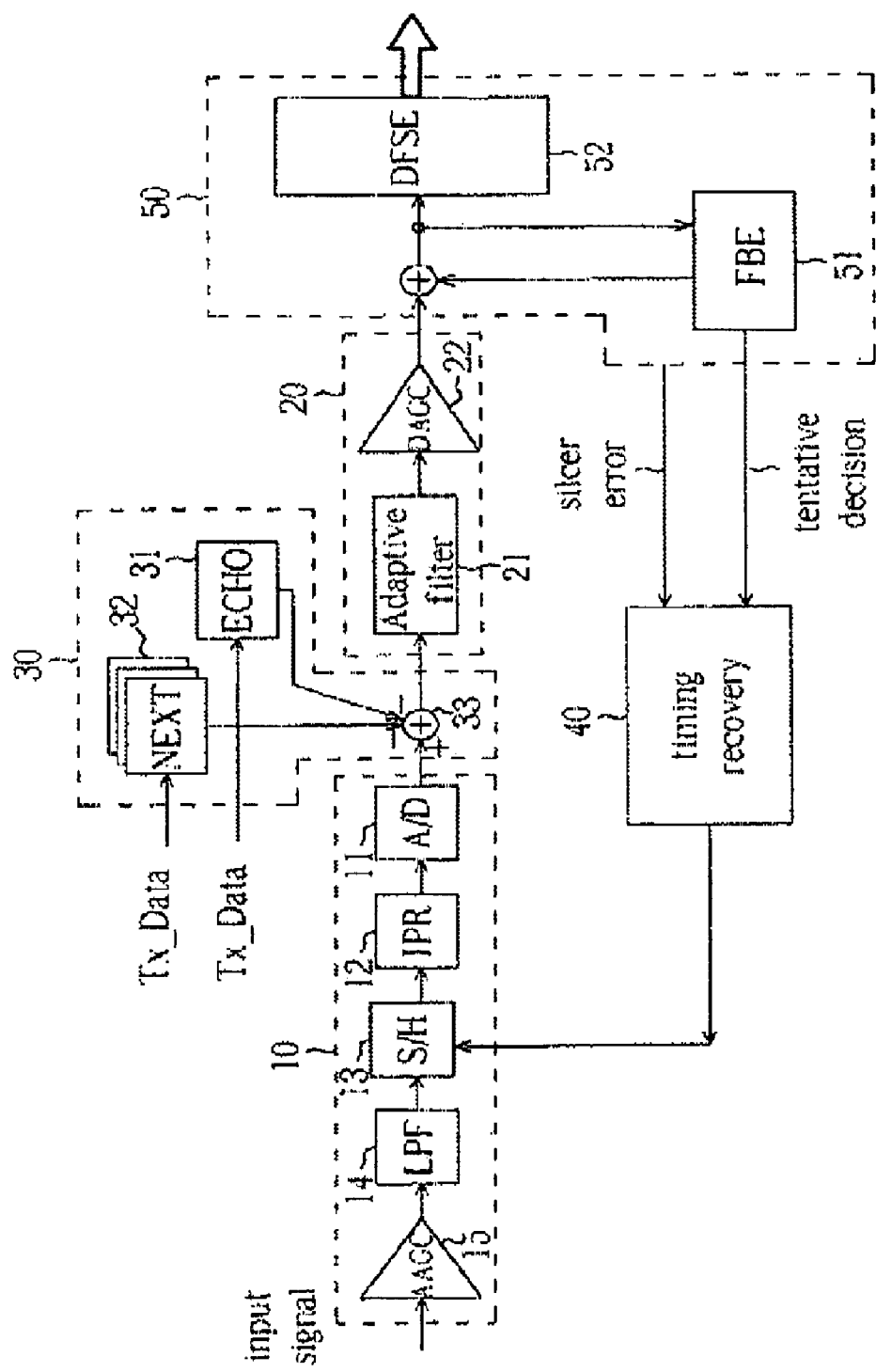
FIG. 3 is a circuit diagram of the receiver of FIG. 2 according to the embodiment of the present invention.

FIG. 3 is a detailed block diagram of the receiver for the network transceiver according to FIG. 2. The front-end receiver 10 includes an analog-to-digital converter (ADC) 11, an inverse partial response (IPR) filter 12, a sample-and-hold (S/H) circuit 13, a low pass filter (LPF) 14, and an analog auto-gain controller (AAGC) 15. The AAGC 15 is coupled to an input signal for adjusting the amplitude of the input signal. The LPF 14 is coupled to the AAGC 15 for filtering high frequency part of the input signal and thus generating a filtered input signal. The S/H circuit 13 is coupled to the LPF 14 for sampling and holding the filtered input signal and thus generating an S/H signal.

In the conventional Gigabit transceiver architecture, the conventional IPR filter is set after the A/D converter 11 and is for filtering the digital signal equivalent to the receiving analog signal. In the present invention, the IPR filter 12 is set prior to the AID converter 11 and functions to compensate the ISI introduced by the partial response filter in the transmitter part of the remote transceiver. Thus, a peak-to-average ratio of the receiving signal is reduced when the signal outputted from the IPR filter 12 enters to the ADC 11. Through the cooperative function of the S/H circuit 13, the IPR filter 12, the A/D converter 11, and the timing recovery 40, the quantization noise of the receiving signal is minimized and a signal-to-noise ratio of the receiving signal is increased. In this embodiment, the IPR filter 12 is an infinite impulse response (IIR) filter with a transfer function of $$\frac{1}{\frac{3}{4}+\frac{1}{4}Z^{-1}}.$$

The ADC 11 is coupled to the IPR filter 12 for generating a first signal in digital form.

The noise canceller 30 coupled to the ADC 11 includes an echo canceller 31, three near-end cross-talk (NEXT) cancellers 32, and an adder 33. The echo canceller 31 is for canceling the echo effect caused by the transceiver transmitting and receiving signals through the same channel. The NEXT cancellers 32 are for canceling the cross-talk effect caused by the transceiver transmitting and receiving signals through one channel while transmitting and receiving signals through other channels. The adder 33 is for subtracting noises produced by the echo canceller 31 and the NEXT cancellers 32 from the first signal and thus generating a second signal.

Suppose that an optimal coefficient for the FFE 20 is ffe(n). However, since the operation of the FFE 20 and the timing recovery (TR) 40 are interactive, the coefficient produced by the FFE 20 may become ffe(n)*sinc(n−τ), wherein * is the convolution operation, n is a timing index, τ is a timing delay, and the shifting factor sinc(n−τ) is caused by the interaction with timing recovery. In the present invention, the main-tap of the FFE 20 is set to be 1 and a right-hand tap closest to the main-tap is set to a fixed value, the influence of sinc(n−τ) to ffe(n), which means the interaction between the FFE 20 and TR 40 can thus be reduced. In this manner, the convergence speed of the coefficient of the FFE 20 can be reduced. The determined coefficient of the FFE 20 can be approximate or equaled to the optimal solution ffe(n).

Figure 4:
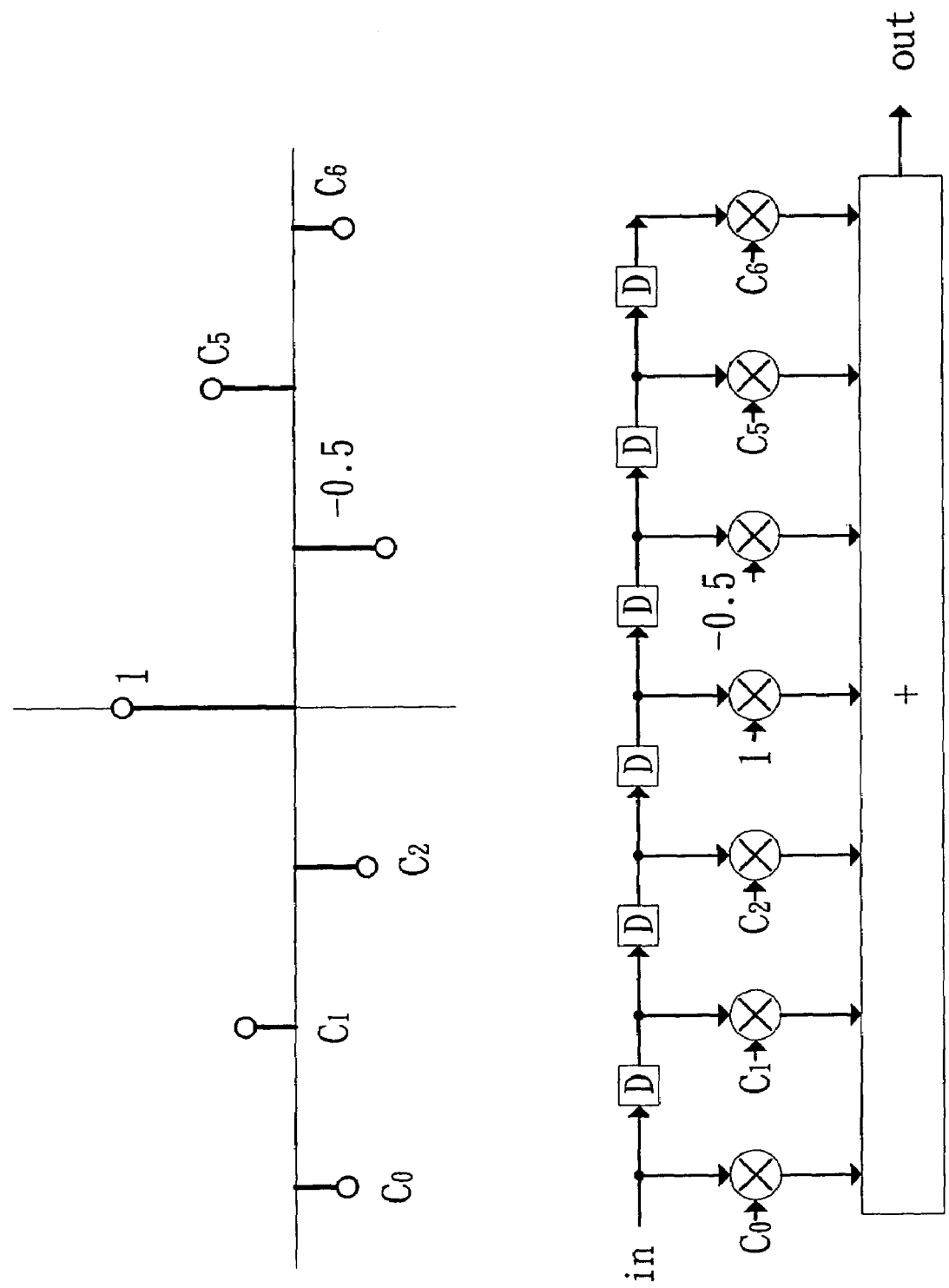
FIG. 4 is a circuit diagram of an adaptive filter according to the embodiment of the present invention.

The FEE 20 is coupled to the noise canceller 30 for generating a third signal through eliminating the pre-cursor component of the second signal. The FFE 20 includes an adaptive filter 21 and a digital auto-gain controller (DAGC) 22. The adaptive filter 21 is a finite impulse response filter. The circuit diagram of the adaptive filter 21 is shown in FIG. 4. In this embodiment, a transfer ftmciion of the adaptive filter 21 is $C_0Z^3+C_1Z^2+C_3Z^1+1+C_4Z^{-1}+C_5Z^{-2}+C_6Z^{-3}$, where $C_0, C_1, C_2, C_4, C_5$ and $C_6$ are adjustable constants and Z delay element. The main-tap is set to be 1. Through setting the main-tap to be a predetermined value, preferably, 1, the circuit complexity of the FFE 20 can he simplified. In addition, a right-hand tap adjacent to the main-tap $C_4$ is set to be 0.5 according to the simulation and the practical experiment. The DAGC 22 is coupled to the adaptive filter 21 for adjusting the magnitude of the signal outputted from the adaptive filter 21 to meet the operating range requirement of the decoding system 50. The adjustment ofihe DAGC 22 is based on the constants determined by the adaptive filter 21. Through setting the main-tap to be 1 and the right-hand tap adjacent to the main-tap $C_4$ to be 0.5, the output signal of the DAGC 22 must do the corresponding adjustment.

The decoding system 50 includes a feedback equalizer (FBE) 51 and a decision feedback sequence estimator (DFSE) 52. The decoding system 50 is coupled to the FFE 20 for decoding the third signal and eliminating the post-cursor component in the third signal. The decoding system 50 also generates a slicer error signal. The slicer error signal is applied to adjust coefficients of the echo canceller 31, the NEXT cancellers 32, and the FBE 51. The FBE 51 is for eliminating the post-cursor component of the third signal. An output signal of the decoding system 50 is a tentative decision signal. The tentative decision signal and the slicer error signal are transmitted to the timing recovery 40 for determining sampling frequency and phase of the timing recovery 40. The timing recovery 40 generates a timing signal to the S/H circuit 13 for determining sampling timing of the S/H circuit 13.

The reliability of the slicer error is determined through eye-pattern diagram. When an eye-pattern is not opened (SNR<10 dB), the coefficients of both the echo canceller 31 and the NEXT cancellers 32 are converged slowly and the timing shift of the FFE 20, the FBE 51, and the timing recovery 40 may thus become serious. In this manner, the convergence of the coefficients of the system are more difficult to be estimated. In order to solve this problem, more training symbols is used in initialization to pre-estimate coefficients of the cancellers 31 and 32 through orthogonal principle. The expression is as follows:

$$Eh(D) = E[Rx(D) \cdot Td(D)] \qquad (1)$$
$$= E[(Eh(D) \cdot Td(D) + Ch(D) \cdot Rd(D) + N(D)) \cdot Td(D)]$$

where
Rx(D) is the received signal,
Eh(D) is the echo channel response,
Td(D) is the transmission data,
Ch(D) is the transmission channel response,
Rd(D) is the remote transmission data, and
N(D) is noise.

Because the Td(D) and Rd(D) and N(D) are uncorrelated and Td(D) is an independent identical (i.i.d.) signal, ensemble average operation can be performed to replace the conventional expectation operation to obtain the required echo channel response. Accordingly, the equation (1) is changed as follows.

$$Eh = \frac{\sum_{i=1}^{N} Rx(i) \cdot Td(i)}{N} \quad (2)$$

$$Eh_{i+1} = Eh_i + \frac{1}{N} \cdot Rx(i) \cdot Td(i) \text{ for } 1 \leq i \leq N$$

Figure 5:
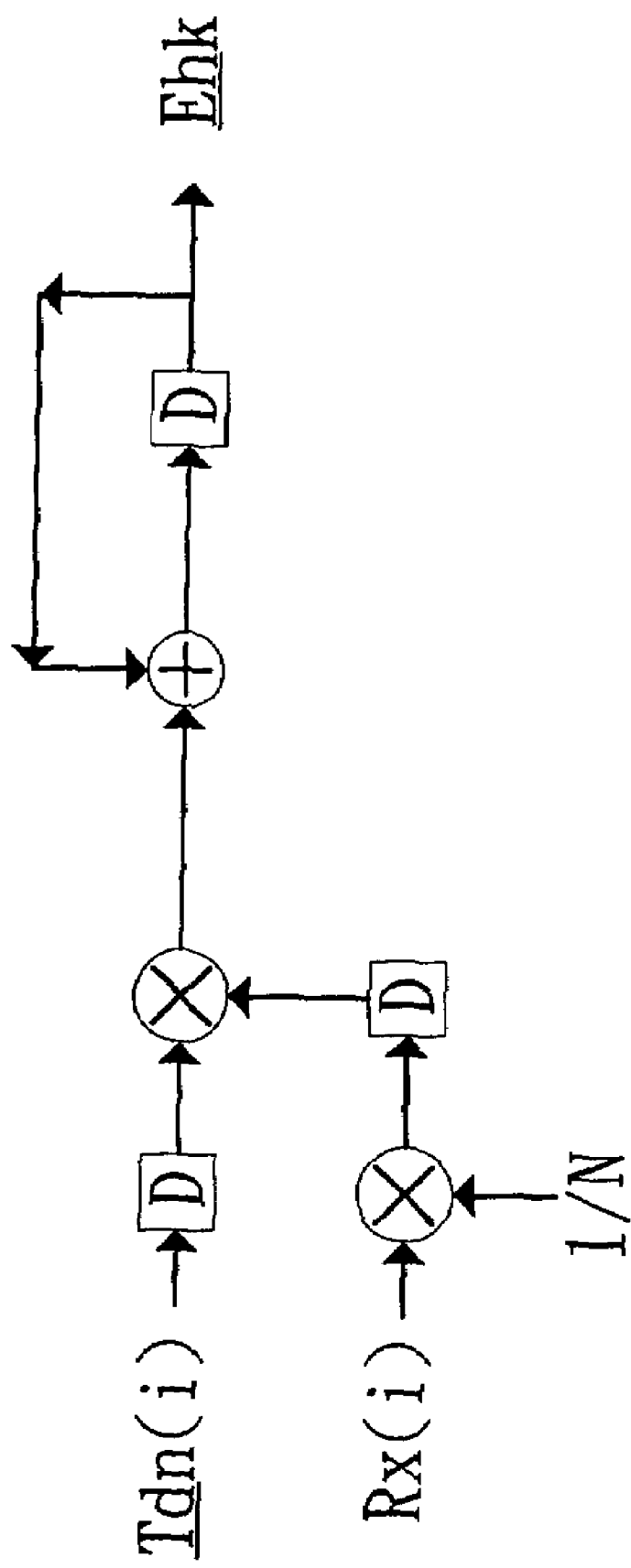
FIG. 5 is a circuit diagram of a reference echo canceller according to the embodiment of the present invention.

The equation (2) can be implemented by a circuit shown in FIG. 5 for pre-estimating and presetting coefficients of the cancellers 31 and 32 in initialization and thus speeding up the system convergence.

In the present invention, the Gigabit Ethernet transceiver the coefficients of the cancellers 31 and 32 can be determined without the effect caused by the FFE 20. Additionally, the configuration of the DAGC 22 and the adaptive filter 21 are implemented in the transceiver. The main-tap of the adaptive filter 21 is set to be 1 and the right-hand tap closest to the main-tap is set to be a fixed value. Furthermore, the received signal is passed through the inverse partial response filter 12, of which the response function is opposite to a partial response filter at transmitting-end, before inputting into the analog-to-digital converter (ADC) 11. The peak-to-average ratio (PAR) of the received signal and the quantization noise can thus be reduced. The signal-to-noise ratio (SNR) is improved.

Although the present invention has been explained in relation to its preferred embodiment, it is to be understood that many other possible modifications and variations can be made without departing from the spirit and scope of the invention as hereinafter claimed.

What is claimed is:

1. A transceiver of a communication system, comprising:
   a front-end receiver for generating a first signal with a pre-cursor component and a post-cursor component according to a receiving signal, wherein the front-end receiver further includes an inverse partial response (IPR) filter to compensate an ISI introduced by a partial response filter in a transmitter part of a remote transceiver and an analog-to-digital (A/D) converter to receive an output signal of the IPR filter and convert the output signal to the first signal with a digital format;
   a noise canceller coupled to the front-end receiver for generating a second signal through eliminating the noise of the first signal;
   a Feed-Forward Equalizer (FFE) coupled to the noise canceller for generating a third signal through eliminating the pre-cursor component in the second signal according to a transfer function including a plurality of adjustable constants, wherein the adjustable constants includes a main-tap and the value of the main-tap is predetermined; and
   a decoder coupled to the FFE for decoding the third signal and eliminating the post-cursor component in the third signal.

2. The transceiver as claimed in claim 1, wherein the front-end receiver further includes a sample-and-hold circuit to sample and hold the receiving signal.

3. The transceiver as claimed in claim 2, wherein the transceiver further includes a timing recovery coupled to the decoder for controlling the sample-and-hold circuit according to an output signal of the decoder.

4. The transceiver as claimed in claim 1, wherein the IPR filter, is an infinite impulse response filter.

* * * * *